United States Patent [19]

Lefeldt

[11] Patent Number: 4,825,171
[45] Date of Patent: Apr. 25, 1989

[54] TESTING DEVICE FOR VOLTAGE TESTING OF CABLES AND CABLE SETS

[75] Inventor: Ekkehard Lefeldt, Börnhoved, Fed. Rep. of Germany

[73] Assignee: HDW-Elektronik GmbH, Kiel, Fed. Rep. of Germany

[21] Appl. No.: 944,558

[22] Filed: Dec. 19, 1986

[30] Foreign Application Priority Data

Jan. 9, 1986 [DE] Fed. Rep. of Germany ....... 3600391
Aug. 28, 1986 [DE] Fed. Rep. of Germany ....... 3629352

[51] Int. Cl.⁴ ............................................ G01R 31/14
[52] U.S. Cl. ..................................... 324/544; 324/551
[58] Field of Search ............... 324/544, 543, 541, 551, 324/539, 557

[56] References Cited

U.S. PATENT DOCUMENTS 3,421,076 1/1969 Eigen ................................... 324/544
4,001,674 1/1977 Schneider ........................... 324/544

FOREIGN PATENT DOCUMENTS 1066411 4/1967 United Kingdom ................ 324/544

Primary Examiner—Reinhard J. Eisenzopf
Assistant Examiner—Robert W. Mueller
Attorney, Agent, or Firm—Nils H. Ljungman

[57] ABSTRACT

A testing apparatus for testing with D.C. and charging a cable. Through periodically switchable switching elements, like a switch-over or a switching rotor, the cable alternately swings via a choke coil and rectifier into an opposite polarity and re-swings again during the ensuing reswitching via a choke coil and rectifier into the previous polarity. As a result, the cable, after each switching break, is charged up to the original voltage by a testing apparatus with positive or negative polarity in order to compensate for the swing-over and current losses.

5 Claims, 4 Drawing Sheets

TESTING DEVICE FOR VOLTAGE TESTING OF CABLES AND CABLE SETS

BACKGROUND OF THE INVENTION

1. Field of the Invention

The invention relates to a testing device for the testing of the electrical voltage of cables and cable sets used in high and medium voltage applications, especially cables with PE- or XLPE-isolation. In particular, the invention relates to a device for testing cables consisting of a rectifying electric voltage testing apparatus which, through a switch, places a charge on the cable up to a desired voltage.

2. Description of the Prior Art

In order to examine the performance and safety of cables after installation, after repair or after certain periods, cables are subjected to a test voltage which is higher than their maximum working voltage. The magnitude and duration of test voltages are specified by pertinent regulations. In regard to the core-ground-voltage of cables, it is possible, for instance, to test by either double effective alternating voltages of 50 Hz or by sixfold rectified voltages.

In general, the rectified voltage test is preferred since it can be executed with a substantially lesser effort than an alternating voltage test. A testing apparatus employing rectified voltage need only generate a spark current or a shunt current of a few millampere. On the other hand, an alternating voltage test apparatus must generate a relatively high reactive energy, depending on the cable capacity. Even though only one core of the cable is tested at a given time, reactive currents of more than 10 ampere may be needed. Due to cost, size and weight, alternating voltage test apparatus are, therefore, very expensive and thus not widely used.

In addition, the rectified voltage testing of PE-isolated cables may present a problem since field-disturbing space charges may be generated by the test. This, together with the strain due to polarity changes during a voltage spike, can cause significant cable damage. The voltage spike need not necessarily occur within the cable itself but may also occur within a coupling-box or within a final closure.

In order to avoid space charges on one hand, but also to get along with less energy on the other hand, some alternating voltage test apparatus employ testing generators which operate at a very low frequency, so-called VLF-generators. These generators work at a frequency of about 0.1 Hz. However, even with a test frequency of 0.1 Hz, the cable must be charged and discharged twice within 10 seconds. In comparison with a pure rectified voltage test with large cable capacities, this still is very expensive because considerable energy must either be stored in the test generator or transformed after each discharge into heat.

SUMMARY OF THE INVENTION

It is an object of the invention to provide a simple testing device which, with little effort, allows the testing of newly installed cable sets, as well as the determination of damages in the cable insulation and thereby guarantees an increase in their operational safety and reliablity.

This goal is achieved by the invention in such a way that the charged cable is periodically switched in one switching position via a choke coil and a rectifier installed upstream thereof into the opposite polarity. In another switching position the cable swings back to the original polarity if necessary via a choke coil and a reversely polarized rectifier, whereby the cable in the one switching position of the switching elements is rechargable up to the original voltage by the associated testing apparatus with positive and/or negative polarity for compensation of isolation and current losses.

A simple configuration with two rectifiers in a circuit with reversed polarity consists in forming the switching element by a change-over switch.

In order to create a favorable situation for avoiding polarization strain, it is proposed to size the inductance of the choke coil in such a way that the switching process results in a voltage gradient which does not form a measurable standing wave.

In order to establish a testing voltage which changes continuously in time, also in order to find out by specifically directed voltage flashes any hollow channels created by so-called "water trees", it is proposed that after each changing of the switch, the cable is connected directly with the choke coil until the discharge occurs, and that after the switch has been opened, the cable is rechargeable again to the polarity as established by the switch's polarity through the associated testing apparatus parts. The thus caused continuous timewise changing voltage results in intensive gas discharges and, due to erosion, a complete voltage flash occurs in a relatively short period.

In order to keep the arrangement of the invention simple, it is proposed that the switching element is formed by a controllable switching rotor with contacts. The contacts are associated with stationary contacts. A rectifier is set between first and second contacts of the switch rotor. A contact bridge is connected from the second rotor contact to a third rotor contact. The switching rotor with its contacts can be adjusted in such a way that in one half period a switching position occurs in which, after changing to the changing polarity via a testing apparatus, the cable is charged and recharged, respectively, to a voltage. The switching rotor then swings into another switching position for the other half period via a rectifier and choke coil to charge the cable to an opposite polarity. A complete separation of the apparatus from the cable can be achieved.

The switch separation into the second switching position does not result in an additional discharge of the cable through switch resistors. The consequence of this is that after the swing-over through the choke coil the voltage in the pertinent half wave remains nearly constant and, therefore, no recharging become necessary and a separate testing apparatus for this half wave can be omitted.

In order to equalize the differences between the electrical voltages in each half wave of testing with regard to distortion during the voltage duration, it is proposed that the testing apparatus can be turned on by a switch controllable by the switching rotor. The testing apparatus can be turned on with a timed delay after the switch to charging polarity has occurred, whereby the timed delay is determined by the half wave distortion which must be equalized. This prevents the formation of asymmetrical harmonics.

In order to avoid overly large voltage differences in the whole circuit, thereby taking into consideration the charged cascade capacitors in the testing apparatus, it is intended that a discharge of the testing apparatus can be adjusted after the cable has been charged but before it is switched over to an opposite polarity. This is accomplished by corresponding contacts during the rotation of the switching rotor by establishing contact with rectifier and choke coils.

In order to slow the switch-over process in view of avoiding standing waves and to improve the maintaining of the voltage in the half wave without a recharge, it is proposed that a supporting capacitor be connected in parallel with the cable.

The drawing shows schematically various embodiments of the invention. In particular, FIG. 1 illustrates the basic principle of an apparatus according to the invention with a switch-over switch.

DETAILED DESCRIPTION OF THE INVENTION

Figure 1:
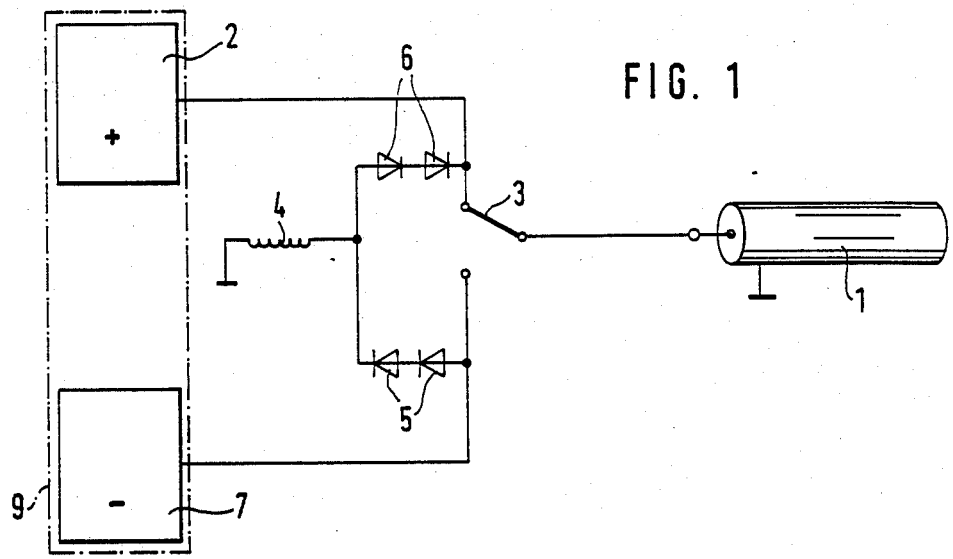
Figure 2:
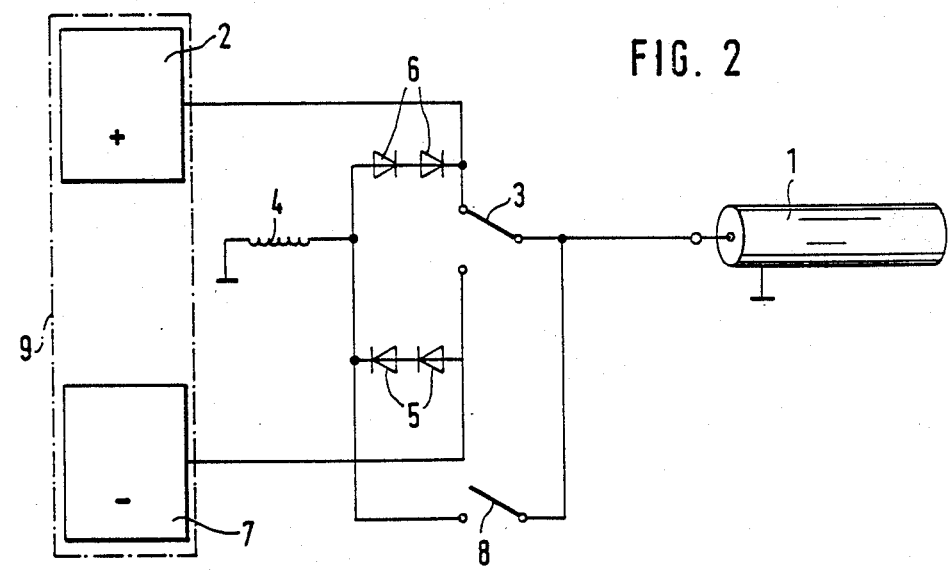
FIG. 2 illustrates an apparatus for a timewise continuously changeable voltage with a switch-over switch.
Figure 3:
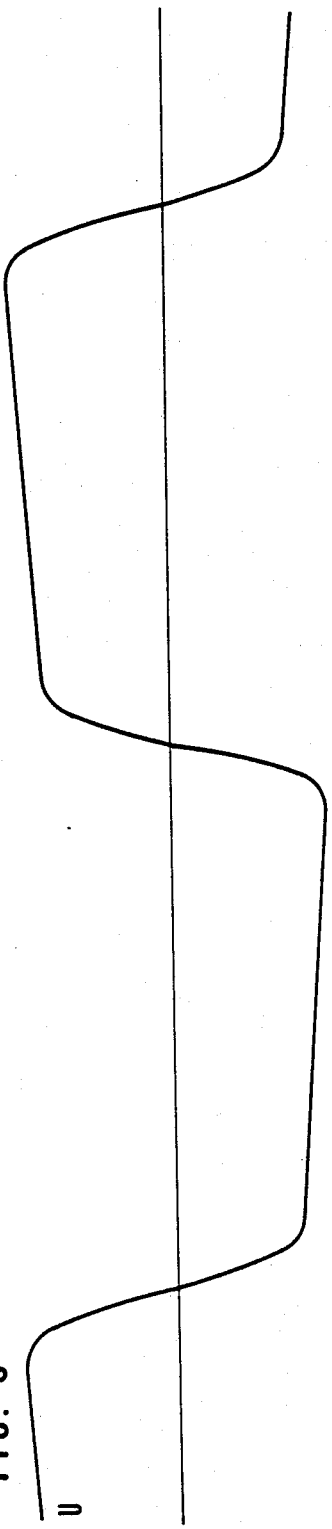
FIG. 3 illustrates a voltage-time diagram of the testing voltage for a testing of the cable by the apparatus illustrated in FIG. 1.

The shown circuit arrangement according to FIG. 1 and FIG. 2 consists of a DC voltage testing apparatus 9 with separate portions of the testing apparatus, positive voltage generator 2 for generating a positive DC voltage, and negative voltage generator 7 for generating a negative D.C. voltage. According to the position of switch 3, a cable 1 is either positively or negatively charged. After switching over of the switch 3, the charges on the cable are dissipated and the cable 1 changes into the opposite polarity as a result of the associated choke coil 4 and rectifier 5 or rectifier 6, respectively.

The losses due to the switching-over to the next polarity and the current losses are compensated for by recharging from the next associated voltage generators 2 or 7. This operating pattern is especially valid for testing of cable sets.

Figure 4:
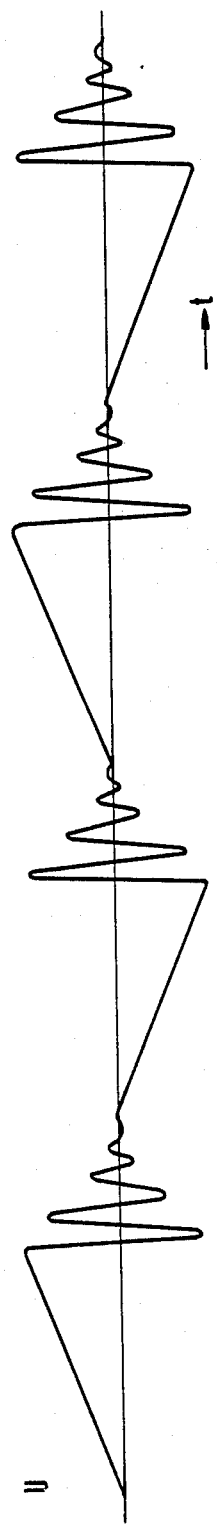
FIG. 4 illustrates a voltage-time diagram of the testing voltage for the testing cable by the apparatus illustrated in FIG. 2.

For cable testing according to the circuit arrangement as shown in FIG. 2, switch 8 is in parallel to switch 3 and is kept closed after each switch-over of switch 3 causing cable 1 to be oscillatingly discharged. Switch 8 is then opened and cable 1 recharges again to the polarity as determined by switch 3. Due to this circuit arrangement, cable 1 is exposed to a timewise continuously changing voltage as is shown by FIG. 4.

Usually switch 3 is periodically operated by a time delay according to specified requirements, whereas switch 8 remains closed by a separate time delay until the complete discharge after every operation of switch 3.

In any of these testing apparatus according to the invention as described herein, one result is that after each changeover of switch 3, cable 1 is discharged by a voltage gradient which avoids formation of a standing wave. This is accomplished by selecting the inductance of coil 4 to prevent the formation of a standing wave. As a result, a cable passes the test by holding the charge during each changeover. An unacceptable cable would fail this testing by failing to hold the applied charge during each changeover cycle.

In an additional embodiment according to FIGS. 5 through 8, a switching rotor 10 is arranged as a switch element which has reciprocally staggered contacts 11, 12 and 13 with which are associated corresponding stationary contacts 14, 15 and 16. The switching rotor 10 is rotated by a motor 17 according to the testing requirements.

The switching rotor 10 includes diode rectifiers 18 which are arranged between contacts 11 and 13. In addition, between contact 13 and contact 12 there is an interconnecting wire such as contact bridge 19.

Figure 5:
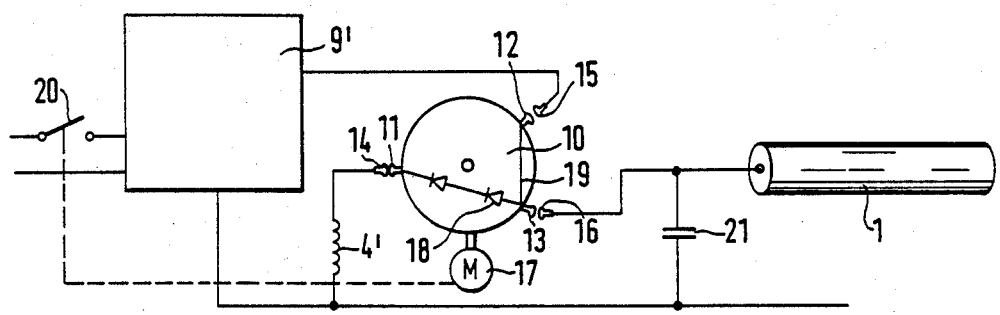
FIG. 5 illustrates an additional circuit arrangement with a switching rotor in a charge position as switching position for a half period.

During a half period, the switching rotor 10 remains in the position shown in FIG. 5. In this position cable 1, after it has swung over into position for charging after being previously charged to the opposite polarity, is charged through contacts 13, 16 and the contact bridge 19 and the contacts 12, 15 by the testing apparatus 9' to the desired voltage. This results in cable 1 being recharged after discharge or dissipation of the previous charge on cable 1 through contacts 11 and 14, the choke coil 4' and the rectifier 18. Subsequently, the switching rotor 10 via motor 17 is rotated through the positions according to FIGS. 6 and 7 into the position according to FIG. 8 and remains in that position during the following half period.

Figure 6:
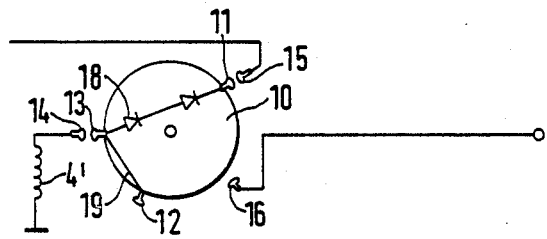
FIG. 6 illustrates an interim position of the switching rotor according to FIG. 5 for a discharge of the testing apparatus.
Figure 7:
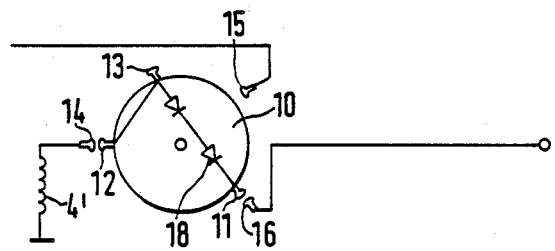
FIG. 7 illustrates an interim position of the switching rotor according to FIG. 5 for a switch-over of the cable into an opposite polarity.

During rotation of the switching rotor 10, a discharge of the testing apparatus 9' with its cascade capacitors through the rectifier 18 and the choke coil 4' occurs in the position as shown in FIG. 6 through contacts 11, 15 and 13, 14. After the rotation of the switching rotor 10 to the position as shown in FIG. 7, the cable 1 is charged into opposite polarity for the latter half period of the test.

Figure 8:
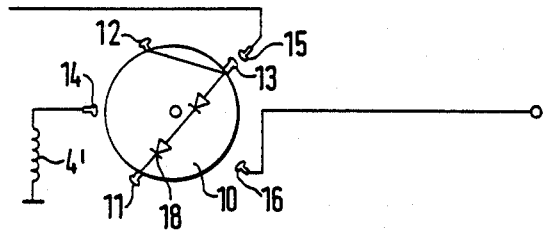
FIG. 8 illustrates a switching position of the switching rotor according to FIG. 5 with a complete separation of the cable for another half period.

In the position as shown in FIG. 8, the cable 1 is completely isolated from the circuit arrangement and is in the test mode. The voltage in the cable as a result of the latter half period is essentially maintained after the switching-over through choke coil 4'. During this isolation, a minimal discharge can only occur through an extremely high internal cable resistance. Therefore, any discharge indicates a faulty cable. A voltmeter or other voltage measuring device may be used to measure the voltage in the cable to determine any voltage drop indicating a faulty cable. After the waiting period, the switching rotor is returned into the position as shown in FIG. 5. Thereby, the cable 1 again switches into the charge polarity and is connected to testing apparatus 9'.

In order to equalize any remaining distortions during the applied voltage duration between both half periods (this may cause asymmetric harmonics), testing apparatus 9' is switched on by a switch 20 (as indicated by the dotted line in FIG. 8) which is controllable through switching rotor 10 and is only switched on during charging phases with a time delay after the switching over into a charging polarity. The time delay is determined by the distortion during the applied voltage duration.

In addition, in order to slow down the switching-over process, a supporting capacitor 21 is arranged parallel to cable 1 so that no standing waves come into existence. Such a supporting capacitor 21 also improves maintaining of voltage while there is no recharging, during the second half period.

Figure 9:
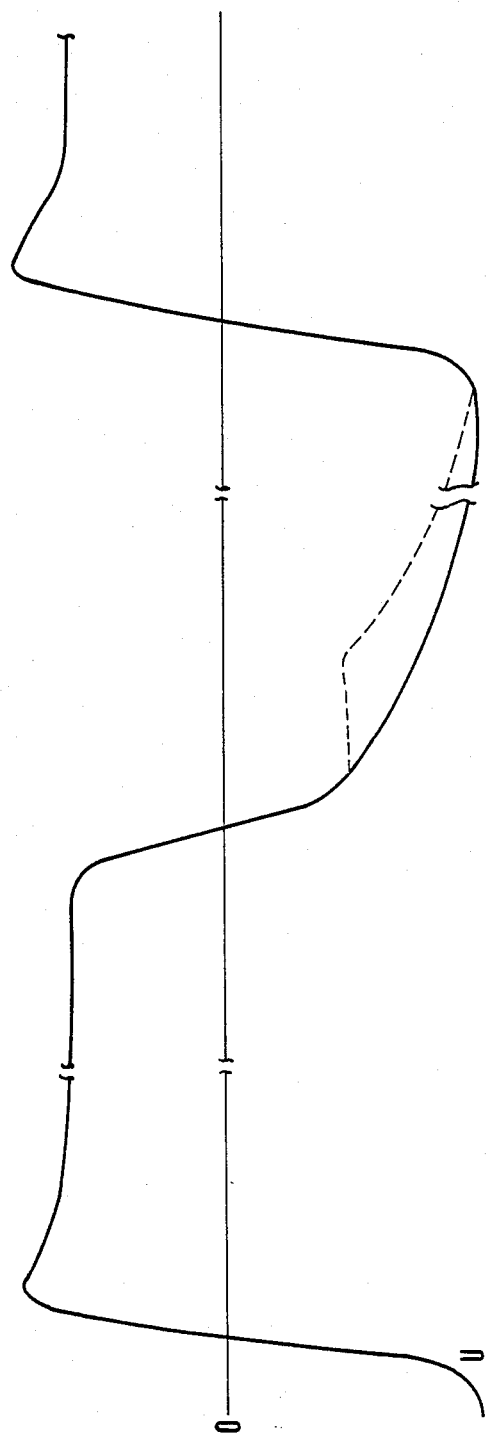
FIG. 9 illustrates a voltage-time diagram of the testing voltage for the testing of a cable by an apparatus with a switching rotor.

The represented voltage time diagram as shown in FIG. 9 begins at the switching-over process after cable 1 has been negatively charged. After the switch-over, cable 1 is positively charged. Then, cable 1 begins to discharge initially for a short period due to possible spark losses. The then ensuing very slow reduction of voltage is determined by the very large time constant of the internal discharge process. After this half period has been finished, cable 1 swings into the reversely polarized position and is negatively charged, i.e., the next charging half period. Eventually, due to recharging, the voltage increases again to the original amount. The dotted form of the curve occurs due to equalizing different distortions or asymmetric harmonics during the applied voltage duration. The recharging is done by delay.

What is claimed is:

1. A testing device for voltage testing of cables and cable sets for withstanding high and medium electric voltage variations, especially of cables with PE- or XLPE-isolation, comprising:
    a rectified electric voltage testing means for generating a positive voltage and negative voltage;
    a first switch associated with said testing means and connected to the cable for alternate application of a positive voltage and a negative voltage to the cable to charge the cable to a desired voltage, losses occurring in said testing device due said voltage application, means to compensate due to said alternate voltage applications, including
    first dissipating means including a first rectifier connected between the switch and the positive voltage of the testing means for dissipating any negative charges on the cable; and second dissipating means including a second rectifier connected between the switch and the negative voltage of the testing means for dissipating any positive charges on the cable;
    whereby the cable is alternately positively and negatively charged by periodically switching the first switch in one switching position and then the other switching position, the change-over process is allowed to take place without the formation of any measurable wave, and losses from said positive voltage application are compensated by said negative voltage application, while losses from said negative voltage application are compensated by said positive voltage application;
    said first switch comprising:
    a controllable switching rotor with first, second and third contacts with which are associated corresponding stationary contacts connected to said cable, said coil and said generators, said rotor having a rectifier between said first and second contacts as well as a contact bridge between said second and third contacts, whereby the switching rotor can be adjusted with its contacts so that in a half period a switching position results in which the cable is charged by the testing apparatus and, after the switching rotor has been turned to another switching position for the other half period through rectifier and said choke coil, the cable changes into an opposite polarity and is isolated from the apparatus.

2. A testing device for voltage testing of cables and cable sets for withstanding high and medium electric voltage variations, especially of cables with PE- or XLPE-isolation, comprising:
    a rectified electric voltage testing means for generating a positive voltage and negative voltage,
    a first switch associated with said testing means and connected to the cable for alternately applying a positive voltage and a negative voltage to the cable to charge the cable to a desired voltage, first dissipating means connected between the switch and the positive voltage of the testing means for dissipating any negative charges on the cable; and second dissipating means connected between the switch and the negative voltage of the testing means for dissipating any positive charges on the cable;
    whereby the cable is alternately positively and negatively charged by periodically switching the first switch in one switching position and then the other switching position,
    wherein said first and second dissipating means include a rectifier and a choke coil for allowing the change-over process to take place with a voltage gradient without the formation of any measurable wave, and
    further including a second switch between said coil and said cable, wherein after each time the first switch has been changed, the cable is selectively connected by the second switch directly to the choke coil, so that the cable is oscillatingly discharged, after which the second switch is opened, whereby the cable is again charged to the polarity provided by the first switch,
    wherein said first switch includes a controllable switching rotor with first, second and third contacts with which are associated corresponding stationary contacts connected to said cable, said coil and said generators, said rotor having a rectifier between said first and second contacts, as well as a contact bridge between said second and third contacts, whereby the switching rotor can be adjusted with its contacts so that in a half period a switching position results, in which the cable is charged to one polarity, and, after the switching rotor has been turned to another switching position for the other half period through said recifier and said choke coil, the cable changes to a opposite polarity opposite to said one polarity.

3. The testing device according to claim 2 including a third switch controllable by the switching rotor for controlling power to said voltage generators so that said voltage generators can be turned on with a time delay after the switching over to the charging polarity whereby the time delay is determined by the half wave distortion resulting from asymmetric harmonics during successive voltage duration which has to be equalized.

4. The testing device according to claim 2 including means for controlling the discharge of the testing device after the cable has been charged, whereby said discharge occurs before the cable changes over to an opposite polarity as a result of contact during the rotation of the switching rotor by corresponding contact between the testing apparatus and the rectifier and choke coil.

5. The testing device according to claim 2 further comprising a supporting capacitor in parallel with the cable.

* * * * *